(12) United States Patent
Hoogkamp et al.

(10) Patent No.: US 7,131,999 B2
(45) Date of Patent: Nov. 7, 2006

(54) LITHOGRAPHIC APPARATUS AND DEVICE MANUFACTURING METHOD

(75) Inventors: Jan Frederik Hoogkamp, Breda (NL); Jan Jaap Kuit, Veldhoven (NL); Raimond Visser, Best (NL)

(73) Assignee: ASML Netherlands B.V., Veldhoven (NL)

( * ) Notice: Subject to any disclaimer, the term of this patent is extended or adjusted under 35 U.S.C. 154(b) by 44 days.

(21) Appl. No.: 10/950,674

(22) Filed: Sep. 28, 2004

(65) Prior Publication Data

US 2006/0066832 A1 Mar. 30, 2006

(51) Int. Cl.
*G03B 27/58* (2006.01)

(52) U.S. Cl. .......................................... 901/40; 355/72
(58) Field of Classification Search ................ 355/72; 901/30, 40; 483/18
See application file for complete search history.

(56) References Cited

U.S. PATENT DOCUMENTS

| | | | |
|---|---|---|---|
| 4,722,659 A * | 2/1988 | Hoyt et al. ............ | 414/222.01 |
| 5,135,349 A * | 8/1992 | Lorenz et al. ........... | 414/744.6 |
| 6,158,951 A * | 12/2000 | Carr et al. ................ | 414/749.4 |
| 2003/0017034 A1* | 1/2003 | Davis et al. ................. | 414/404 |
| 2004/0005211 A1* | 1/2004 | Lowrance et al. ........ | 414/744.1 |

* cited by examiner

Primary Examiner—W. B. Perkey
Assistant Examiner—Vivian Nelson
(74) Attorney, Agent, or Firm—Pillsbury Winthrop Shaw Pittman, LLP

(57) ABSTRACT

A lithographic apparatus includes an illumination system configured to condition a radiation beam; a support configured to support a patterning device, the patterning device being capable of imparting the radiation beam with a pattern in its cross-section to form a patterned radiation beam; a substrate table configured to hold a substrate; a projection system configured to project the patterned radiation beam onto a target portion of the substrate; and a robot configured to transfer an exchangeable object to and from a support region, the robot including an arm and an end effector, the end effector including a first and second carrier configured to carry respective exchangeable objects, and the end effector being rotatably connected to the arm of the robot around a rotation axis which extends substantially parallel to the support region.

24 Claims, 3 Drawing Sheets

LITHOGRAPHIC APPARATUS AND DEVICE MANUFACTURING METHOD

BACKGROUND

1. Field of the Invention

The present invention relates to lithographic apparatus and methods.

2. Description of the Related Art

A lithographic apparatus is a machine that applies a desired pattern onto a substrate, usually onto a target portion of the substrate. A lithographic apparatus can be used, for example, in the manufacturing of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A conventional lithographic apparatus includes a support constructed to support the abovementioned patterning device. The support generally includes a number of retractable pins, so-called R-pins, configured to push the patterning device somewhat upwardly from the support or to lower it down into the support during exchange thereof. Sideways of the support, two manipulators are provided, each with an end effector having a carrier configured to transport respective patterning devices to and from the retractable pins. Thus, it is possible to extend the pins upwardly, pick up a patterning device from the pins with one of the manipulators, move it to another station, meanwhile place a patterning device on the still extended pins with the other manipulator, and retract the pins in order to lower the patterning device in the support. Such construction/configuration, with the retractable pins and the two manipulators, however, is rather complex and expensive.

Furthermore, a lithographic apparatus generally includes a support constructed to support the abovementioned patterning device, and two vertically moveable manipulators attached to a turret (rotating table). The turret with the manipulators is mounted above the support. Each manipulator includes an end effector connected thereto having a carrier configured to pick up a respective patterning device directly from the support or to place it thereon, when, depending on the position of the turret, the respective manipulator is positioned above the support. Thus, it is possible to pick up a patterning device from the support with one of the manipulators, rotate the turret, and place a patterning device in the support with the other manipulator. The turret, however, incorporates large required strokes and may need a four-axis manipulator in order to transport the patterning devices to and from the turret. Exchanging a patterning device with such a construction/configuration may be time consuming if the manipulator is required.

SUMMARY

Embodiments of the invention include a lithographic apparatus configured to quickly and efficiently exchange objects, like patterning devices and/or substrates, to and from a support region destined to form a support structure for the specific type of exchangeable object.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a manipulator or robot configured to manipulate an exchangeable object to and from a support region, the manipulator or robot including an end effector, the end effector including a first and second carrier configured to carry respective exchangeable objects, and the end effector being rotatably connected to the manipulator or robot around a rotation axis which extends substantially parallel to the support region.

A lithographic apparatus in accordance with an embodiment of the invention includes an illumination system configured to condition a radiation beam; a support configured to support a patterning device, the patterning device being capable of imparting the radiation beam with a pattern in its cross-section to form a patterned radiation beam; a substrate table configured to hold a substrate; a projection system configured to project the patterned radiation beam onto a target portion of the substrate; and a robot configured to transfer an exchangeable object to and from a support region, the robot including an arm and an end effector, the end effector including a first and second carrier configured to carry respective exchangeable objects, and the end effector being rotatably connected to the arm of the robot around a rotation axis which extends substantially parallel to the support region.

By providing the end effector with the at least two carriers, and by connecting the end effector rotatably around the rotation axis to the manipulator or robot, a reduced number of servo axis can be used. Furthermore, a permanent construction directly above the support region is not necessary.

The term "support region" as used herein broadly refers to the region in which a bottom side of the exchangeable object is lying when it is supported. In an embodiment of the invention, the support region can be a support plane (i.e. the support region can lie in a plane). It will be appreciated that the support region can be an imaginary region extending through several support points or a supporting surface of a support structure. The support structure may be the support constructed to support a patterning device, the substrate table constructed to hold a substrate, or any other support structure destined to form a support for a specific type of exchangeable object in the lithographic apparatus.

In an embodiment of the invention, the position of the carriers on the end effector is such that upon rotation of the end effector around the rotation axis, each carrier can be positioned with respect to the support region such that a take over of the patterning device with the support structure can be carried out.

In an embodiment of the invention, the position of a carrier on the end effector is tangential with an imaginary cylinder having its center axis defined by the rotation axis.

In another embodiment of the invention, the first and second carrier are positioned parallel above one another and the angle between the first and second carrier on the end effector is 180 degrees.

In an embodiment of the invention, the manipulator or robot includes a manipulator or robot with two or more arms rotatably connected to each other by further linkages, a proximal end of a first arm of the two or more arms being rotatably connected to a base part, and the end effector with the at least two carriers being rotatably connected around the rotation axis arranged on a distal end of the two or more arms. This configuration offers a large degree of freedom to the manipulator or robot and makes it possible to use only one manipulator, which can be positioned sideways of the support structure, leaving the space above the support structure free. For example, the manipulator or robot can move the end effector above the support region, having the first carrier pick up the patterning device from the support structure, rotate the end effector around the rotation axis, have the second carrier place another patterning device in the support structure, and move the end effector away from the support structure.

In another embodiment of the invention, the manipulator or robot includes one arm moveably arranged with respect to a base part in a direction perpendicular to the support region, and positioned above the support, and the end effector being rotatably connected around the rotation axis with a distal end of the arm. This type of manipulator or robot is simple and makes it possible to pick up an exchangeable object from the support structure with the first carrier, move the arm upwardly, rotate the end effector, move the arm downwardly, and place another patterning device in the support structure with the second carrier.

In an embodiment of the invention, the above manipulator or robot is used in combination with a second manipulator or robot for manipulating an exchangeable object to and from the end effector of the first manipulator, the second manipulator including an end effector with a carrier configured to carry an exchangeable object. Thus, exchangeable objects carried by the first and/or second carriers on the rotatable end effector of the first manipulator can be placed and removed by the carrier of the second manipulator.

In an embodiment of the invention, the second manipulator or robot is of the type including two or more arms rotatably connected to each other by further linkages, a proximal end of a first arm of the two or more arms being rotatably connected to a base part, and the end effector being arranged on a distal end of the two or more arms. This configuration offers a large degree of freedom to the second manipulator or robot and makes it possible not only to place and remove exchangeable objects to and from the first manipulator or robot, but also directly to and from the support structure.

According to an embodiment of the invention, there is provided a device manufacturing method including conditioning a radiation beam by an illumination system; supporting a patterning device on a support, the patterning device imparting the radiation beam with a pattern in its cross-section forming a patterned radiation beam; holding a substrate on a substrate table; and projecting the patterned radiation beam by a projection system onto a target portion of the substrate, wherein an exchangeable object is manipulated by a manipulator or robot to transport it to and from a support region, the manipulator including an end effector, the end effector including a first and second carrier configured to carry respective exchangeable objects, the end effector being rotatably connected to the manipulator or robot around a rotation axis which extends substantially parallel to the support region, and wherein the end effector is rotated around its rotation axis for exchange of the exchangeable object on the support region.

A device manufacturing method according to an embodiment of the invention includes patterning a beam of radiation; projecting the patterned beam of radiation onto a target portion of a substrate, and transferring an exchangeable object to and from a support region with a robot, wherein the robot includes an arm and an end effector, the end effector including a first and second carrier configured to carry respective exchangeable objects, the end effector being rotatably connected to the arm of the robot around a rotation axis which extends substantially parallel to the support region, and wherein the end effector is rotated around its rotation axis for exchange of the exchangeable object on the support region.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
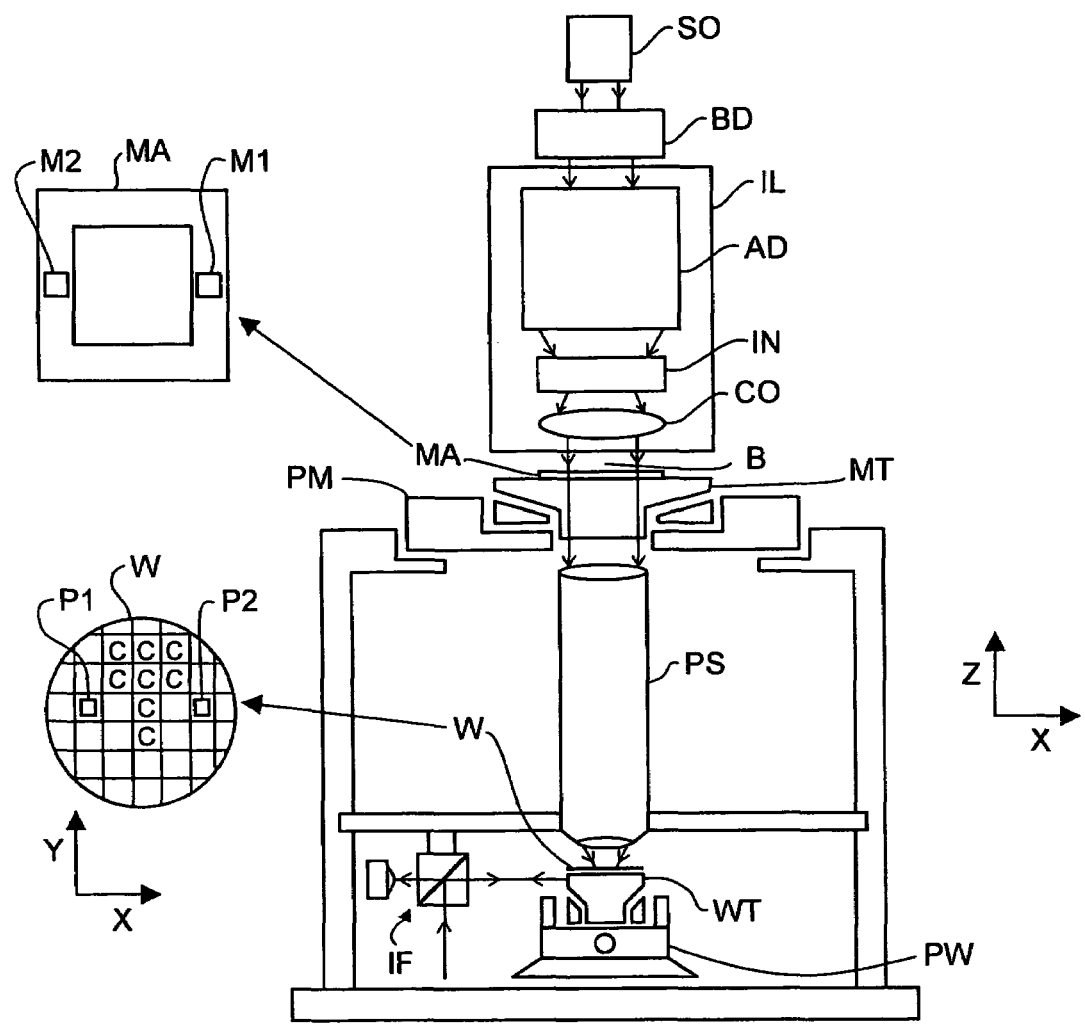
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation) and a support structure (e.g. a mask table) MT configured to support a patterning device (e.g. a mask) MA and connected to a first positioning device PM configured to accurately position the patterning device in accordance with certain parameters. The apparatus also includes a substrate table (e.g. a wafer table) WT configured to hold a substrate (e.g. a resist-coated wafer) W and connected to a second positioning device PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode; the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 3:
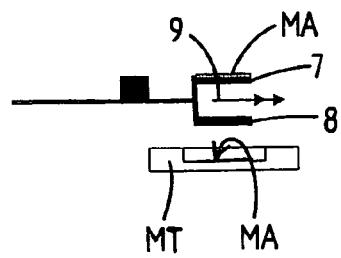
FIG. 3 depicts a side view of the end effector of the manipulator or robot in accordance with an embodiment of the invention.
Figure 2:
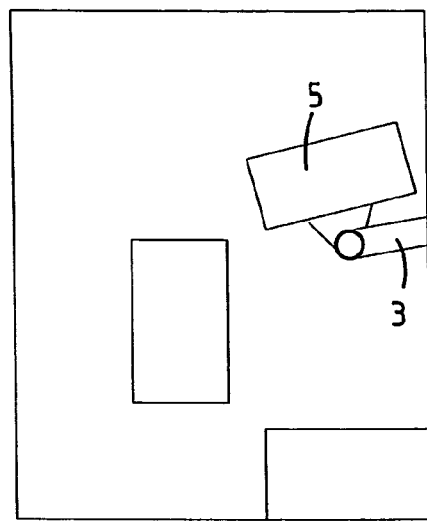
FIG. 2 schematically depicts, but in more detail, a manipulator or robot configured to transport patterning devices to and from the patterning device support in accordance with an embodiment of the invention.

FIGS. 2 and 3 show an embodiment of a manipulator or robot 1 that may be built in the apparatus of FIG. 1 and configured to transfer the patterning device MA to or from the support structure MT in FIG. 1. The manipulator or robot 1 is a robotic arm construction which includes two arms 3, 4 rotatably connected to a base part 5, which may be connected to a supporting frame of the lithographic apparatus. The two arms 3, 4 are connected to each other by linkages, for example formed by servo axis. The distal end of the second arm 4 is provided with an end effector 6, which has a first and second carrier 7, 8 connected thereto. As can be seen in FIG. 3, the end effector 6 has a rotation axis 9 via which it is rotatably connected to the second arm 4. The rotation axis 9 extends parallel to a support region of the support structure MT in which region the bottom side of the patterning device is lying in the supported position. In the embodiment shown in FIG. 3, both the support region and the rotation axis extend substantially in the horizontal direction. A servomotor, for example, may drive the rotatable connection. In an embodiment of the invention, the support region lies in a plane.

The first and second carrier 7, 8 are positioned diametrically opposite to one another. Actuation of the servomotor over an angle of approximately 180 degrees thus results in the first carrier 7 taking over the position of the second carrier 8.

Figure 4:
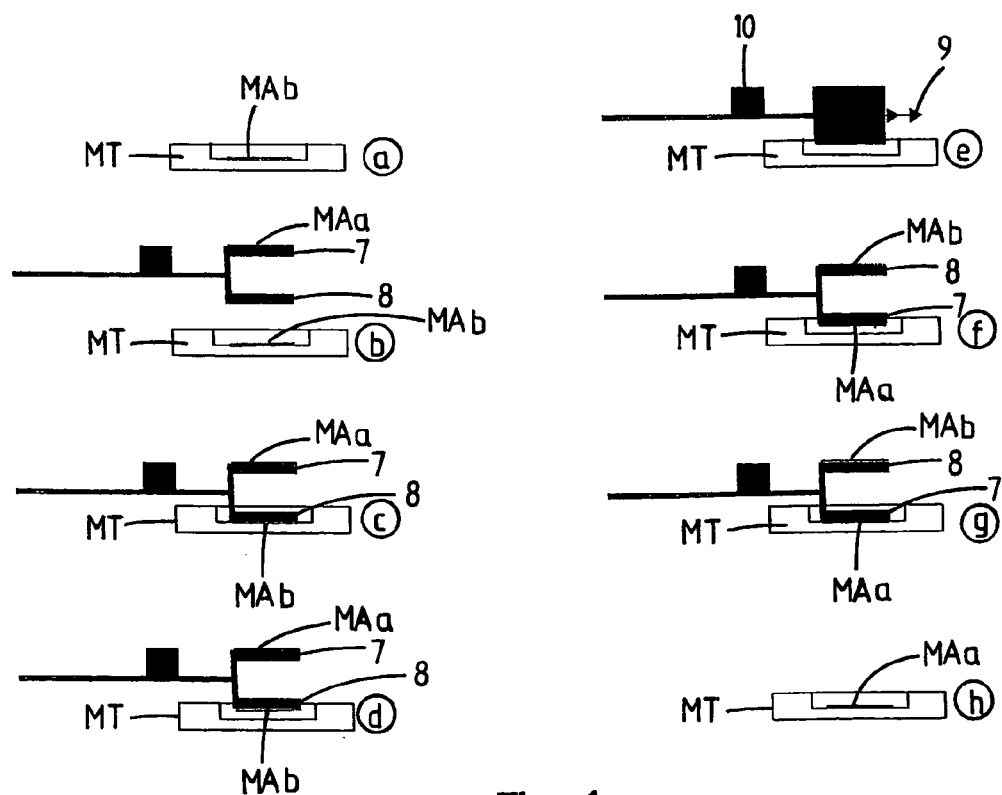
FIGS. 4a–h depict several views, according to FIG. 3, corresponding to several stages for picking up and placing patterning devices with the manipulator or robot.

FIGS. 4(a)–(h) show several steps of a method, which uses the manipulator or robot 1 and its end effector 6 of FIGS. 2 and 3, for exchanging the patterning device MA in the support structure MT. FIG. 4a shows the support structure MT having the patterning device MAb supported therein. During exchange, the manipulator or robot 1 moves the end effector 6, having a further patterning device MAa already held by the first carrier 7, above the support structure MT (FIG. 4b) and lowers the end effector 6 until its second carrier 8 is able to pick up the patterning device MAb from the support structure MT (FIG. 4c). Then, the manipulator or robot 1 moves the end effector 6 upwards (FIG. 4d) and subsequently rotates the end effector 6 around its rotation axis 9 over an angle of approximately 180 degrees (FIGS. 4e and f), so that the first carrier 7 comes to lie downwards. Then, the manipulator or robot 1 lowers the end effector 6 until its first carrier 7 is able to place the patterning device MAa in the support structure MT (FIG. 4g), after which the manipulator or robot 1 moves the end effector 6 away from the support structure MT. As a result, the patterning device MAa may be placed in the support structure MT and the space above the support structure MT is free again from parts of the manipulator or robot 1 (FIG. 4h).

Figure 5:
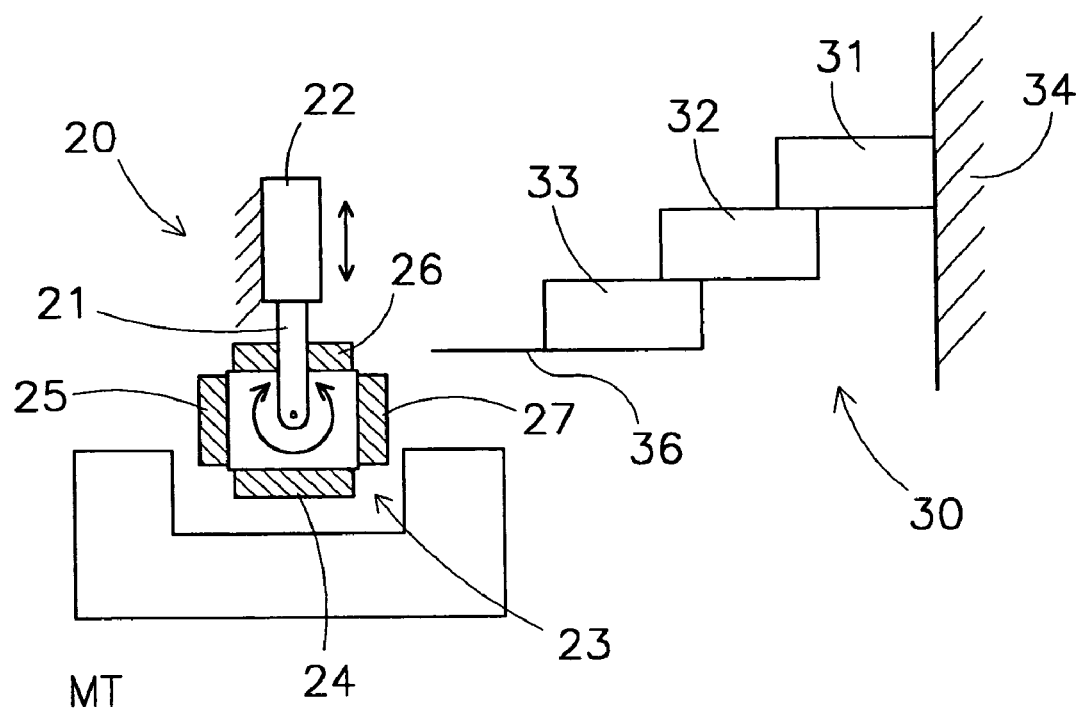
FIG. 5 depicts a side view of a vertical manipulator or robot with rotating end effector according to an embodiment of the invention.

FIG. 5 shows a manipulator or robot in accordance with an embodiment of the invention, which may be built in the apparatus of FIG. 1. As can be seen in FIG. 5, the manipulator or robot 20 has one arm 21 which is moveably arranged with respect to a base part 22, which in turn may be connected to a supporting frame of the lithographic apparatus. The manipulator or robot is positioned above the support structure MT. The distal end of the arm 21 is provided with an end effector 23 which has a first, second, third and fourth carrier 24–27 connected thereto. The end effector 23 is rotatably connected, around a rotation axis, to the arm 21. The rotation axis extends parallel to a support region of the support structure MT, in which region, the bottom side of the patterning device is lying in the supported position. In the embodiment shown in FIG. 5, both the support region and the rotation axis extend substantially in the horizontal direction. A servomotor, for example, may form/drive the rotatable connection.

The carriers 24–27 can be divided equally around the rotation axis, i.e. they can be positioned at right angles with respect to each other. Actuation of the servomotor over right angles (90, 180, 270 degrees) thus results in another carrier taking over the most downward position.

A second manipulator or robot 30 is provided, which is a robotic arm construction and which includes three arms 31, 32, 33 rotatably connected to a base part 34, which may be connected to a supporting frame of the lithographic apparatus. The arms 31–33 are connected to each other by linkages, which may be formed, for example, by servo axes. The distal end of the third arm 33 is provided with an end effector 36 which has a carrier connected thereto.

According to an embodiment of the invention, a method for using the two manipulators or robot 20 and 30 of FIG. 5 in order to exchange a patterning device MA in the support structure MT includes the steps of lowering the end effector 23 until its carrier 24 is able to pick up a patterning device MA from the support structure MT. Then, the manipulator or robot 20 moves the end effector 23 upwardly and subsequently rotates the end effector 23 around its rotation axis over a substantially right angle of, for example, approximately 90, 180 or 270 degrees, until another one of the carriers 25–27 comes to lie downwards. Then, the manipulator or robot 20 lowers the end effector 23 until the newly most downward one of the carriers 25–27 is able to place a new patterning device MA in the support structure MT, after which the manipulator or robot 20 moves the end effector 23 upwardly again with respect to the support structure MT. Thus, the patterning device in the support structure MT can quickly be changed, and a new patterned radiation beam can be achieved therefrom. During this radiation process or at any other desired moment, the second manipulator or robot 30 can move its end effector 36 towards the end effector 23 of the first manipulator or robot 20, in order to place a patterning device on an empty carrier thereof and/or take a patterning device from a carrier thereof. Thus, the patterning devices held by the respective carriers of the end effector 23 of the first manipulator or robot 20 can be quickly changed, particularly at a moment which is not time-critical.

In another embodiment of the invention for using the two manipulators or robots 20 and 30 of FIG. 5, the manipulator or robot 20 may be used to place a new patterning device in the support, whereas the manipulator or robot 30 may be used to remove a used patterning device directly from the support structure MT.

Yet in another embodiment of the invention for using the two manipulators or robot 20 and 30 of FIG. 5, the manipulator or robot 20 may be used to remove a used patterning device from the support structure MT, whereas the manipulator or robot 30 may be used to place a new patterning device directly in the support structure MT.

In case the second manipulator or robot 30 is merely used to pick and place patterning devices directly to and from the end effector 23 of the first manipulator or robot 20 while this end effector 23 is in its upward position, then the second manipulator or robot can also be configured more simply and may include, for example, only one or two arms moveable in the horizontal direction.

In the above embodiments the manipulators or robot have been described in relation to the transfer of patterning devices. Similar manipulators or robots with a similar end effector rotatable around the specifically orientated rotation axis according to an embodiment of the invention could also be used for the transfer of a substrate to or from a substrate table, or for the manipulation of any other exchangeable object to or from a corresponding support structure in a lithographic apparatus.

The carriers may be of various types and may operate, for example, on the basis of vacuum, magnetic forces or electrostatic charge. Furthermore, it will be appreciated that instead of two or four carriers, any other desired number of carriers may be provided on the end effector, and/or the angles between the carriers may be different from 90 or 180 degrees. The support region of the support structure may also be positioned somewhat inclined with respect to the horizontal, with the result that according to an embodiment of the invention, the rotation axis of the end effector may also extend inclined with respect to the horizontal, as long as it extends substantially parallel to the support plane.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCD's), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support configured to support a patterning device, the patterning device being capable of imparting the radiation beam with a pattern in its cross-section to form a patterned radiation beam;
   a substrate table configured to hold a substrate;
   a projection system configured to project the patterned radiation beam onto a target portion of the substrate; and
   a robot configured to transfer an exchangeable object to and from a support region, the robot comprising an arm and an end effector, the end effector comprising a first and second carrier configured to carry respective exchangeable objects, and the end effector being rotatably connected to the arm of the robot around a rotation axis which extends substantially parallel to the support region.

2. The lithographic apparatus of claim 1, wherein the end effector is rotatably connected to the robot around a horizontal rotation axis.

3. The lithographic apparatus of claim 1, wherein the robot is further configured such that upon rotation of the end effector around the rotation axis, each carrier can be positioned with respect to the support region to take the exchangeable object disposed on the support region.

4. The lithographic apparatus of claim 1, wherein the position of a carrier on the end effector is tangential with an imaginary cylinder having its center axis defined by the rotation axis.

5. The lithographic apparatus of claim 1, wherein the first and second carrier are positioned above, and substantially parallel to, one another.

6. The lithographic apparatus of claim 1, wherein a proximal end of said arm is rotatably connected to a base part, and wherein the end effector is rotatably connected to a distal end of said arm around the rotation axis.

7. The lithographic apparatus of claim 1, wherein the robot comprises two or more arms, the two or more arms being rotatably connected to each other by linkages.

8. The lithographic apparatus of claim 1, wherein said arm is moveably arranged with respect to a base part in a direction perpendicular to the support region, and positioned above the support region, and wherein the end effector is rotatably connected around the rotation axis to a distal end of the arm.

9. The lithographic apparatus of claim 8, wherein the arm is movably arranged with respect to the base part in a vertical direction.

10. The lithographic apparatus of claim 8, further comprising a second robot configured to transfer an exchangeable object to and from the rotatable end effector of the first robot or the support region, the second robot comprising an end effector, the end effector of the second robot comprising a carrier configured to carry the exchangeable object.

11. The lithographic apparatus of claim 10, wherein the second robot comprises one or more arms, a proximal end of a first arm of the one or more arms being rotatably connected to a base part, and the end effector being arranged on a distal end of the one or more arms.

12. The lithographic apparatus of claim 11, wherein the second robot comprises two or more arms, the two or more arms being rotatably connected to each other by linkages.

13. The lithographic apparatus of claim 1, wherein the end effector further comprises a third and fourth carrier configured to carry respective exchangeable objects.

14. The lithographic apparatus of claim 1, wherein the exchangeable object is the patterning device and wherein the support region is a support region of the support structure configured to support the patterning device.

15. The lithographic apparatus of claim 1, wherein the exchangeable object is the substrate and wherein the support region is a support region of the support structure configured to hold the substrate.

16. The lithographic apparatus of claim 1, wherein the support region lies in a plane.

17. The lithographic apparatus of claim 1, wherein each of said first and second carriers include a support region that is adapted to support the exchangeable object, said rotation axis extending substantially parallel to the support region of each of said first and second carriers.

18. The lithographic apparatus of claim 17, wherein the support region of said first carrier is substantially perpendicular to the support region of said second carrier.

19. A device manufacturing method comprising:
  patterning a beam of radiation;
  projecting the patterned beam of radiation onto a target portion of a substrate, and
  transferring an exchangeable object to and from a support region with a robot,
  wherein the robot comprises an arm and an end effector, the end effector comprising a first and second carrier configured to carry respective exchangeable objects, the end effector being rotatably connected to the arm of the robot around a rotation axis which extends substantially parallel to the support region, and wherein the end effector is rotated around its rotation axis for exchange of the exchangeable object on the support region.

20. The method of claim 19, wherein said arm is moveably arranged with respect to a base part in a direction perpendicular to the support region, and positioned above the support region, and wherein the end effector is rotatably connected around the rotation axis to a distal end of the arm.

21. The method of claim 19, wherein said exchangeable object is a patterning device configured to pattern the beam of radiation.

22. The method of claim 19, wherein said exchangeable object is the substrate.

23. The method of claim 19, wherein the support region lies in a plane.

24. The method of claim 19, wherein each of said first and second carriers include a support region that is adapted to support the exchangeable object, said rotation axis extending substantially parallel to the support region of each of said first and second carriers.

* * * * *